(12) United States Patent
Sinutko

(10) Patent No.: US 8,396,912 B1
(45) Date of Patent: Mar. 12, 2013

(54) INFINITE IMPULSE RESPONSE RESONATOR DIGITAL FILTER

(75) Inventor: Michael Sinutko, Glen Burnie, MD (US)

(73) Assignee: The United States Government as Represented by the Director, National Security Agency, Washington, DC (US)

(*) Notice: Subject to any disclaimer, the term of this patent is extended or adjusted under 35 U.S.C. 154(b) by 467 days.

(21) Appl. No.: 12/806,256

(22) Filed: Aug. 5, 2010

(51) Int. Cl.
*G06F 17/10* (2006.01)

(52) U.S. Cl. .......................................... 708/300; 708/200

(58) Field of Classification Search .................. None
See application file for complete search history.

(56) References Cited

U.S. PATENT DOCUMENTS

| 5,432,723 | A | | 7/1995 | Chen et al. | |
| 5,487,023 | A | * | 1/1996 | Seckora | 708/316 |
| 6,009,445 | A | | 12/1999 | Tsyrganovich | |
| 6,167,415 | A | * | 12/2000 | Fischer et al. | 708/320 |
| 6,243,729 | B1 | * | 6/2001 | Staszewski | 708/319 |

* cited by examiner

*Primary Examiner* — Michael D Yaary
(74) *Attorney, Agent, or Firm* — Roshni Kurian

(57) ABSTRACT

The IIR resonator digital filter which is the subject of this patent invention comprises a first register having a plurality of inputs and outputs, a multiplexer/demultiplexer having a plurality of inputs and outputs, a first multiplier having a plurality of inputs and an output, a second multiplier having a plurality of inputs and an output, a third multiplier having a plurality of inputs and an output, an adder having a plurality of inputs and an output, a subtractor having a plurality of inputs and an output, and a second register having an input and a plurality of outputs. The IIR resonator digital filter features a multiplexer/demultiplexer that has five logical states.

2 Claims, 6 Drawing Sheets

INFINITE IMPULSE RESPONSE RESONATOR DIGITAL FILTER

FIELD OF INVENTION

The present invention pertains to filters, and in particular to infinite impulse response resonator digital filters.

BACKGROUND OF THE INVENTION

With the need for efficiency in representing cochlear hair cells, the use of an Infinite Impulse Response (IIR) resonator digital filter is preferred over its counterpart, the Finite Impulse Response (FIR) filter. Unlike an FIR filter, an IIR filter provides for computational efficiency and meaningful immediate output following a one cycle initialization, i.e., no staging delays, when given an input.

U.S. Pat. No. 5,432,723, entitled "Parallel Infinite Impulse Response (IIR) Filter with Low Quantization Effects and Method Therefor," discloses a parallel IIR filter that features a multiplier and a number of biquad filters. While the present invention utilizes multipliers, it does not use biquad filters but uses other components not disclosed by Chen et al. in a way that is distinguishable from the device taught in U.S. Pat. No. 5,432,723. U.S. Pat. No. 5,432,723 is hereby incorporated by reference into the specification of the present invention.

U.S. Pat. No. 6,009,445, entitled "Reconfigurable Infinite Impulse Response (IIR) Digital Filter," discloses an IIR filter that uses adders and a number of shift registers. While the present invention utilizes an adder, it also uses other components not disclosed by Tsyrganovich in a way that is distinguishable from the device taught in U.S. Pat. No. 6,009,445. U.S. Pat. No. 6,009,445 is hereby incorporated by reference into the specification of the present invention.

SUMMARY OF THE INVENTION

An object of the present invention is an infinite impulse response resonator digital filter that is more efficiently implemented than existing IIR resonator digital filters.

Another object of the present invention is an infinite impulse response (IIR) resonator digital filter that can be utilized in a biomimetic voice identifier.

The IIR filter which is the subject of this patent invention comprises a first register, a second register, a multiplexer/demultiplexer, a first multiplier, a second multiplier, a third multiplier, an adder, and a subtractor.

DETAILED DESCRIPTION

The present invention is an infinite impulse response (IIR) resonator digital filter that can be utilized in a biomimetic voice identifier.

Figure 1:
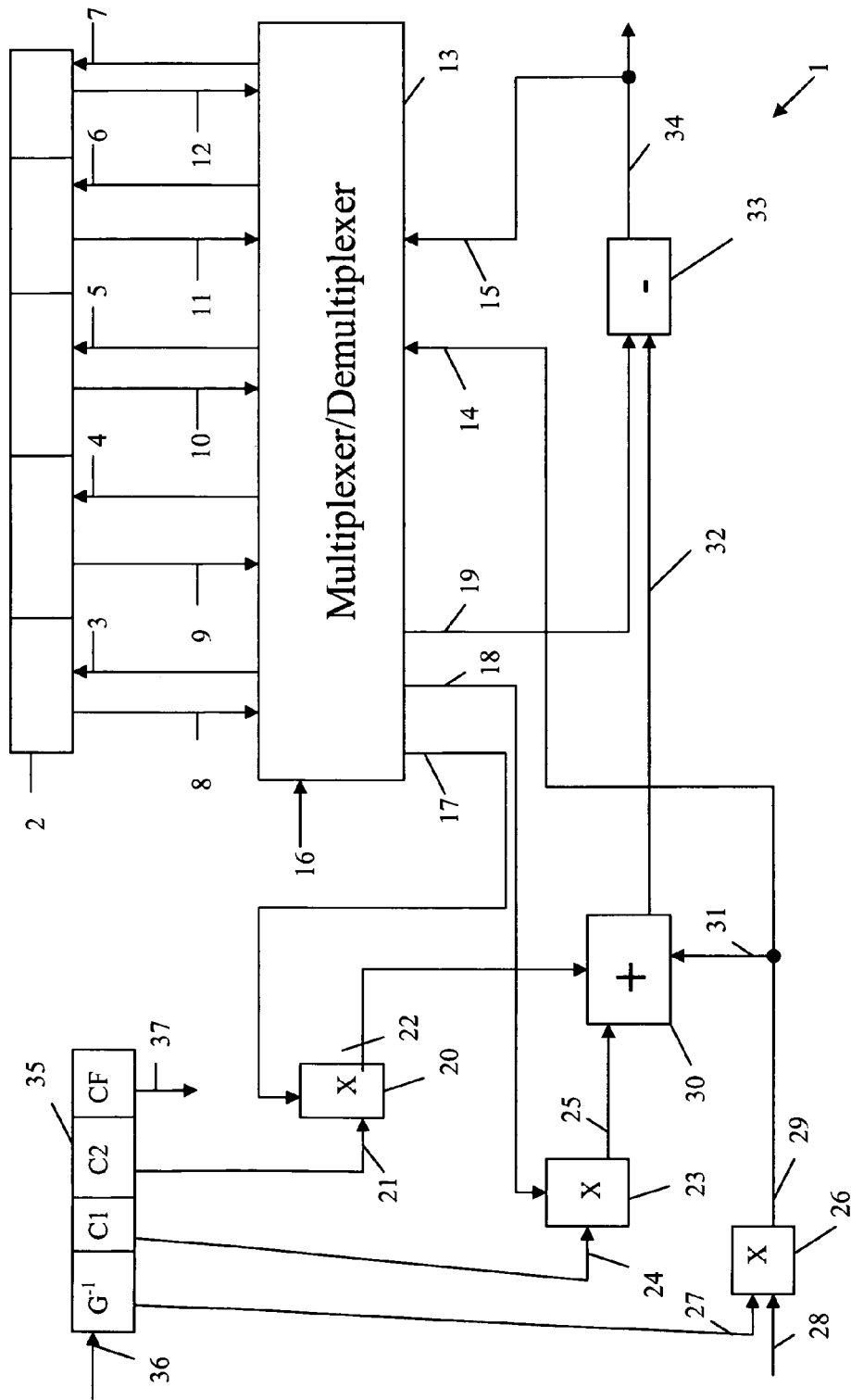
FIG. 1 is a schematic depicting the infinite impulse response resonator digital filter.

FIG. 1 is a schematic representing the infinite impulse response resonator digital filter that is the subject of the present invention.

The first register 2 has a first input 3, a second input 4, a third input 5, a fourth input 6, a fifth input 7, a first output 8, a second output 9, a third output 10, a fourth output 11, and a fifth output 12.

The IIR resonator digital filter 1 also contains a multiplexer/demultiplexer 13. The multiplexer/demultiplexer 13 has a first input connected to the first output 8 of the first register 2, a second input connected to the second output 9 of the first register, a third input connected to the third output 10 of the first register, a fourth input connected to the fourth output 11 of the first register, a fifth input connected to the fifth output 12 of the first register, a sixth input 14, a seventh input 15, and a clock input 16. The multiplexer/demultiplexer 13 also has several outputs including a first output connected to the first input 3 of the first register, a second output connected to the second input 4 of the first register, a third output connected to the third input 5 of the first register, a fourth output connected to the fourth input 6 of the first register, a fifth output connected to the fifth input 7 of the first register, a sixth output 17, having a seventh output 18, and having an eighth output 19.

The IIR resonator digital filter 1 also includes several multipliers. The first multiplier 20 has a first input connected to the sixth output 17 of the multiplexer/demultiplexer 13, a second input 21, and an output 22.

The second multiplier 23 has a first input connected to the seventh output 18 of the multiplexer/demultiplexer 13, a second input 24, and an output 25.

The third multiplier 26 has a first input 27, a second input 28, an output 29 connected to the sixth input 14 of the multiplexer/demultiplexer 13.

The IIR resonator digital filter 1 also incorporates an adder 30 that has a first input connected to the output 22 of the first multiplier 20, a second input connected to the output 25 of the second multiplier 23, a third input 31 connected to the output 29 of the third multiplier 26, and an output 32.

Additionally, the IIR resonator digital filter 1 includes a subtractor 33. The subtractor 33 has a first input connected to the output 32 of the adder 30, a second input connected to the eighth output 19 of the multiplexer/demultiplexer 13, and an output 34 that is fed back into the multiplexer/demultiplexer 13 via its to the seventh input 15. The filter's output can be determined at the subtractor's 33 output 34.

Finally, the IIR resonator digital filter 1 utilizes a second register 35. This second register 35 has one input 36 and four outputs 21, 24, 27, 37. The second register receives and stores four values via its input 36. These values represent the inverse of the filter's gain ($G^{-1}$), a first coefficient ($C_1$), a second coefficient ($C_2$), and a center frequency (CF) respectively. Here $G^{-1}$ is automatically programmed and CF is that of the IIR resonator digital filter which, nominally, is a single-frequency pass filter.

FIGS. 2A-2E depicts each of the programming states of the IIR resonator digital filter's 1 multiplexer/demultiplexer 13 in detail. The IIR resonator digital filter's 1 initial conditions are set at audio sample k=0 and switch positions '1'. With each additional sample, all of the switches rotate one ascending order position.

Figure 2A:
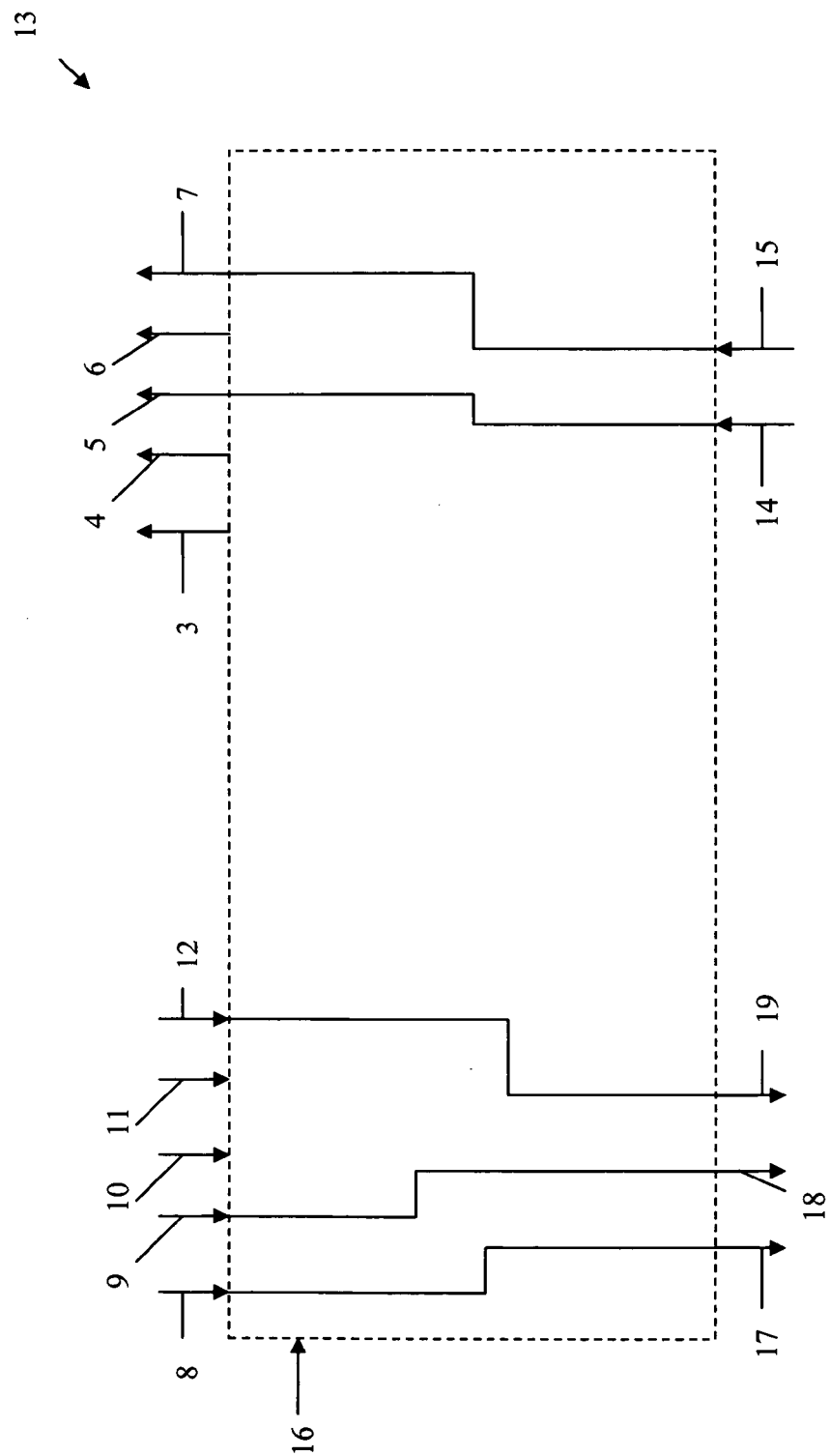
FIG. 2A is a schematic of the first state of the controller array of the multiplexer/demultiplexer.

FIG. 2A is a view of the first state of the controller array of the multiplexer/demultiplexer 13 that has a clock input 16. In this first programming state of the multiplexer/demultiplexer 13, the first 8, second 9, fifth 12, sixth 14, and seventh 15 inputs are connected to the sixth 17, seventh 18, eighth 19, third 5, and fifth 7 outputs respectively.

Figure 2B:
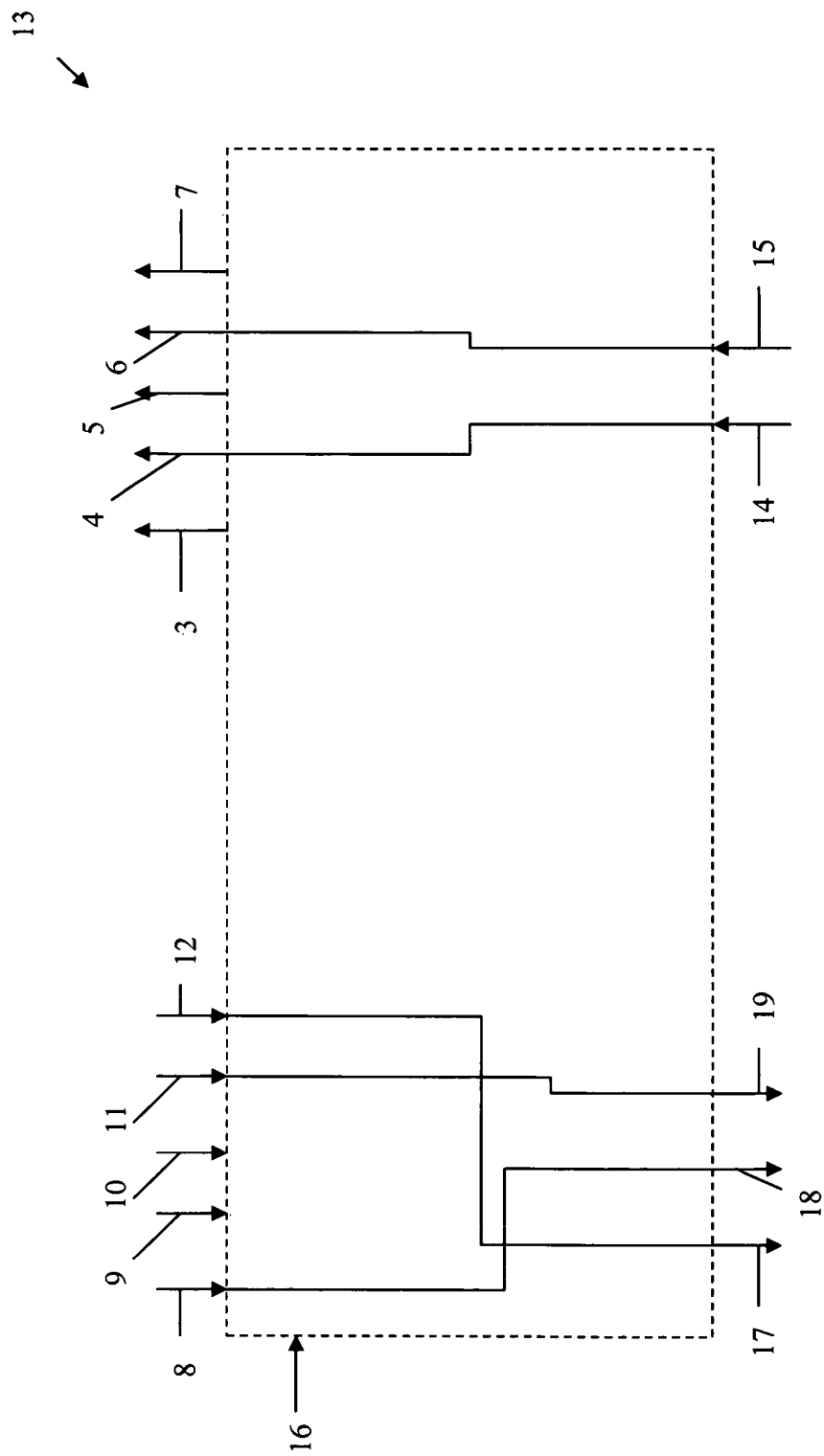
FIG. 2B is a schematic of the second state of the controller array of the multiplexer/demultiplexer.

FIG. 2B is a view of the second state of the controller array of the multiplexer/demultiplexer 13 that has a clock input 16. In this second programming state of the multiplexer/demultiplexer 13, the fifth 12, first 8, fourth 11, sixth 14, and seventh 15 inputs are connected to the sixth 17, seventh 18, eighth 19, second 4, and fourth 6 outputs respectively.

Figure 2C:
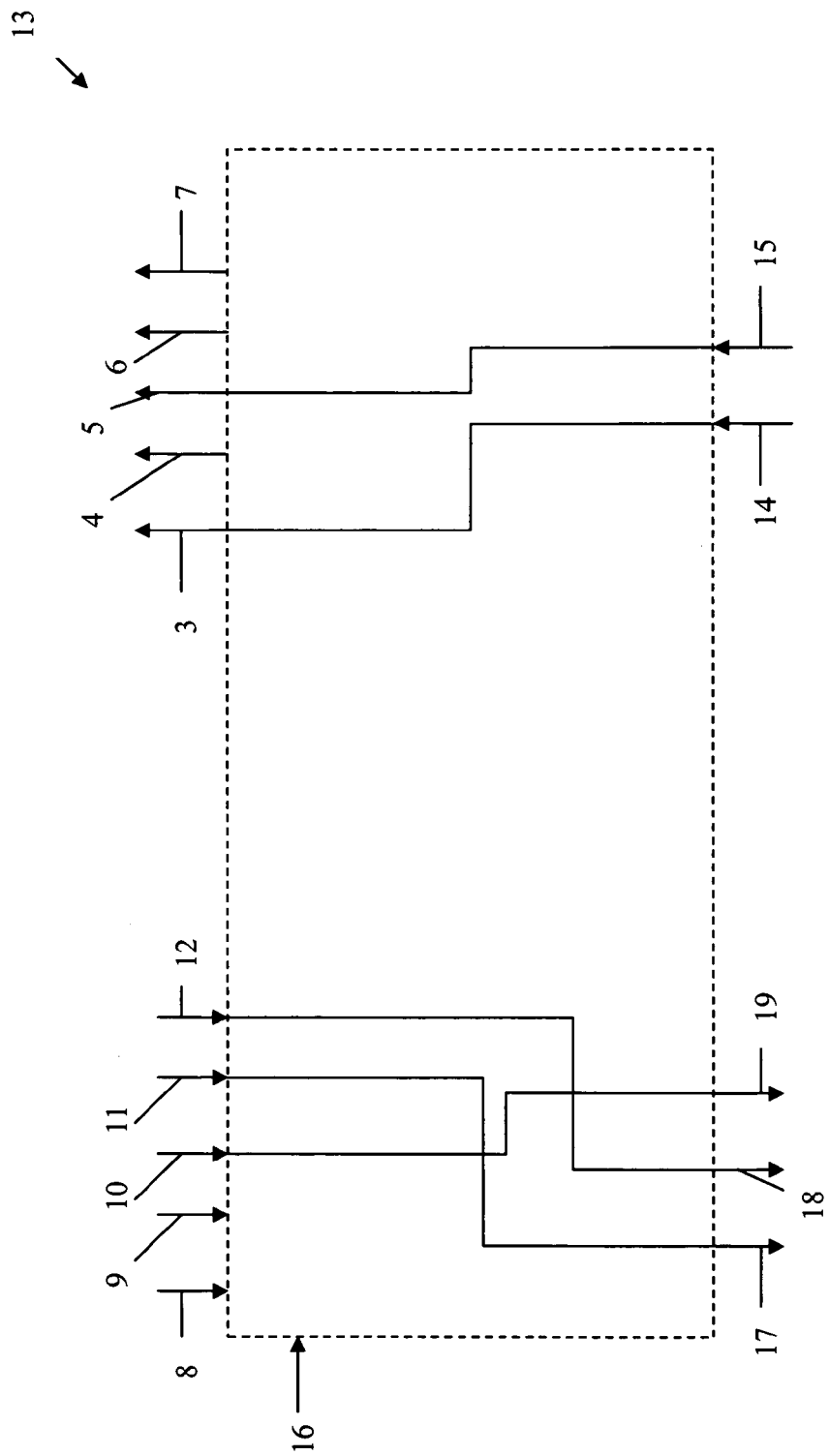
FIG. 2C is a schematic of the third state of the controller array of the multiplexer/demultiplexer.

FIG. 2C is a view of the third state of the controller array of the multiplexer/demultiplexer 13 that has a clock input 16. In this third programming state of the multiplexer/demultiplexer 13, the fourth 11, fifth 12, third 10, sixth 14, and seventh 15 inputs are connected to the sixth 17, seventh 18, eighth 19, first 3, and third 5 outputs respectively.

Figure 2D:
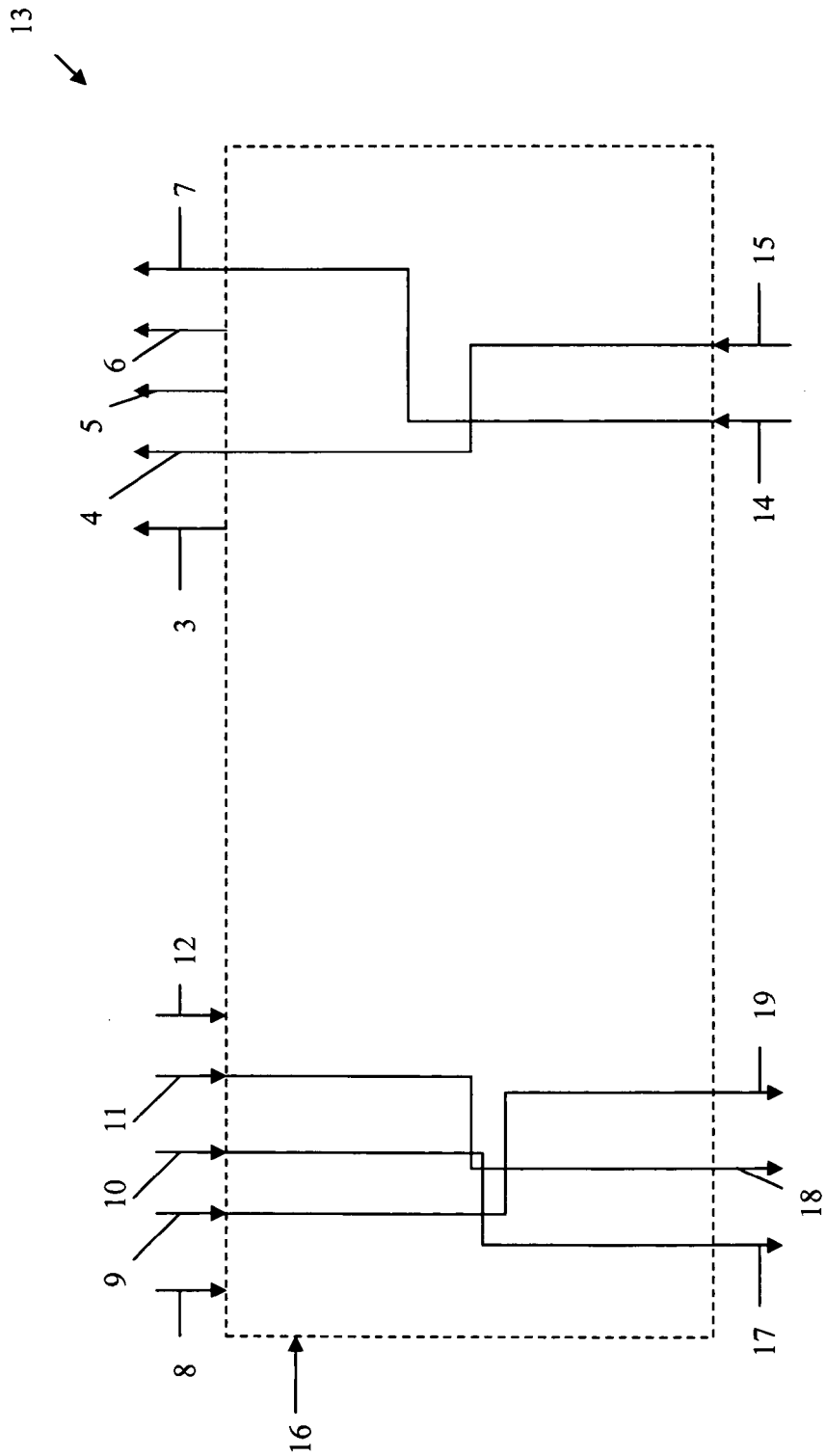
FIG. 2D is a schematic of the fourth state of the controller array of the multiplexer/demultiplexer.

FIG. 2D is a view of the fourth state of the controller array of the multiplexer/demultiplexer 13 that has a clock input 16. In this fourth programming state of the multiplexer/demultiplexer 13, the third 10, fourth 11, second 9, sixth 14, and seventh 15 inputs are connected to the sixth 17, seventh 18, eighth 19, fifth 7, and second 4 outputs respectively.

Figure 2E:
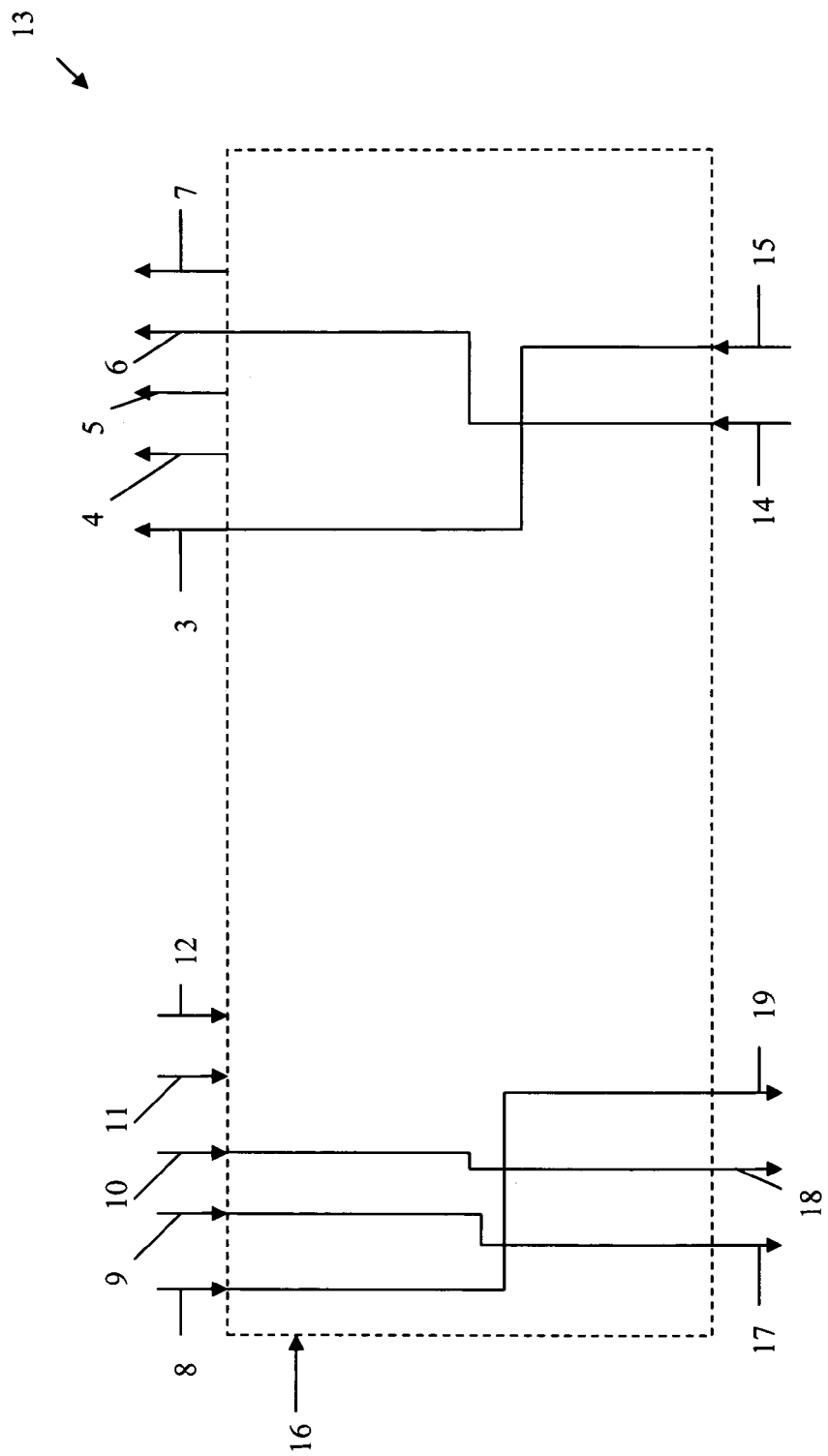
FIG. 2E is a schematic of the fifth state of the controller array of the multiplexer/demultiplexer.

FIG. 2E is a view of the fifth state of the controller array of the multiplexer/demultiplexer 13 that has a clock input 16. In this fifth programming state of the multiplexer/demultiplexer 13, the second 9, third 10, first 8, sixth 14, and seventh 15 inputs are connected to the sixth 17, seventh 18, eighth 19, fourth 6, and first 3 outputs respectively.

While the preferred embodiment has been disclosed and illustrated, a variety of substitutions and modifications can be made to the present invention without departing from the scope of the invention.

What is claimed is:

1. An infinite impulse response resonator digital filter, comprising:
    a) a first register, having a first input, having a second input, having a third input, having a fourth input, having a fifth input, having a first output, having a second output, having a third output, having a fourth output, and having a fifth output;
    b) a multiplexer/demultiplexer, having a first input connected to said first output of said first register, having a second input connected to said second output of said first register, having a third input connected to said third output of said first register, having a fourth input connected to said fourth output of said first register, having a fifth input connected to said fifth output of said first register, having a sixth input, having a seventh input, having a clock input, having a first output connected to said first input of said first register, having a second output connected to said second input of said first register, having a third output connected to said third input of said first register, having a fourth output connected to said fourth input of said first register, having a fifth output connected to said fifth input of said first register, having a sixth output, having a seventh output, and having an eighth output;
    c) a first multiplier, having a first input connected to said sixth output of said multiplexer/demultiplexer, having a second input, and having an output;
    d) a second multiplier, having a first input connected to said seventh output of said multiplexer/demultiplexer, having a second input, and having an output;
    e) a third multiplier, having a first input, having a second input, having an output connected to said sixth input of said multiplexer/demultiplexer;
    f) an adder, having a first input connected to said output of said first multiplier, having a second input connected to said output of said second multiplier, having a third input connected to said output of said third multiplier, and having an output;
    g) a subtractor, having a first input connected to said output of said adder, having a second input connected to said eighth output of said multiplexer/demultiplexer, having an output connected to said seventh input of said multiplexer/demultiplexer; and
    h) a second register, having a first input, having a first output connected to said first input of said third multiplier, having a second output connected to said second input of said second multiplier, having a third output connected to said second input of said first multiplier, and a fourth output.

2. The device of claim 1, wherein said inputs and said outputs of said multiplexer/demultiplexer are connected together in five logical states selected from the group of logical states consisting of:
    a) a first logical state where said first input is connected to said sixth output, said second input is connected to said seventh output, said fifth input is connected to said eighth output, said sixth input is connected to said third output, said seventh input is connected to said fifth output;
    b) a second logical state where said fifth input is connected to said sixth output, said first input is connected to said seventh output, said fourth input is connected to said eighth output, said sixth input is connected to said second output, said seventh input is connected to said fourth output;
    c) a third logical state where said fourth input is connected to said sixth output, said fifth input is connected to said seventh output, said third input is connected to said eighth output, said sixth input is connected to said first output, said seventh input is connected to said third output;
    d) a fourth logical state where said third input is connected to said sixth output, said fourth input is connected to said seventh output, said second input is connected to said eighth output, said sixth input is connected to said fifth output, said seventh input is connected to said second output; and
    e) a fifth logical state where said second input is connected to said sixth output, said third input is connected to said seventh output, said first input is connected to said eighth output, said sixth input is connected to said fourth output, said seventh input is connected to said first output.

* * * * *